United States Patent
Hirano et al.

(10) Patent No.: US 8,531,649 B2
(45) Date of Patent: Sep. 10, 2013

(54) EXPOSURE APPARATUS AND DEVICE FABRICATION METHOD

(75) Inventors: Shinichi Hirano, Utsunomiya (JP); Kohei Yamada, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/495,300

(22) Filed: Jun. 13, 2012

(65) Prior Publication Data

US 2012/0320360 A1    Dec. 20, 2012

(30) Foreign Application Priority Data

Jun. 17, 2011    (JP) ................................. 2011-135694

(51) Int. Cl.
G03B 27/72    (2006.01)
G03B 27/54    (2006.01)

(52) U.S. Cl.
USPC ............................................. 355/71; 355/67

(58) Field of Classification Search
USPC ........ 355/53, 67–71; 250/548; 356/399–401
See application file for complete search history.

(56) References Cited

U.S. PATENT DOCUMENTS

| | | | | |
|---|---|---|---|---|
| 6,680,774 B1 * | 1/2004 | Heinle | ............................. | 355/72 |
| 6,967,710 B2 * | 11/2005 | Shiraishi | .......................... | 355/67 |
| 2005/0212156 A1 | 9/2005 | Tokita et al. | | |
| 2011/0267595 A1 * | 11/2011 | Mori | ............................... | 355/67 |

FOREIGN PATENT DOCUMENTS

JP    2005286062 A    10/2005

* cited by examiner

*Primary Examiner* — Hung Henry Nguyen
(74) *Attorney, Agent, or Firm* — Rossi, Kimms & McDowell LLP

(57) ABSTRACT

The present invention provides an exposure apparatus including a light shielding plate which is placed on a plane conjugate to an object plane of a projection optical system in an illumination optical system, includes, on an edge thereof, an arc that overlaps a circular boundary line inside an outer periphery of a substrate, and defines a region on the substrate, to which a pattern is to be transferred, a detection unit which detects a shift amount between the center position of the substrate and the center position of an array of a plurality of shot regions on a layer, and a control unit which positions the plate at a position, at which the plate shields light incident on an outer peripheral region shifted inward from the outer periphery of the substrate by a predetermined width, based on the shift amount.

5 Claims, 17 Drawing Sheets

FIG. 3A
FIG. 3B
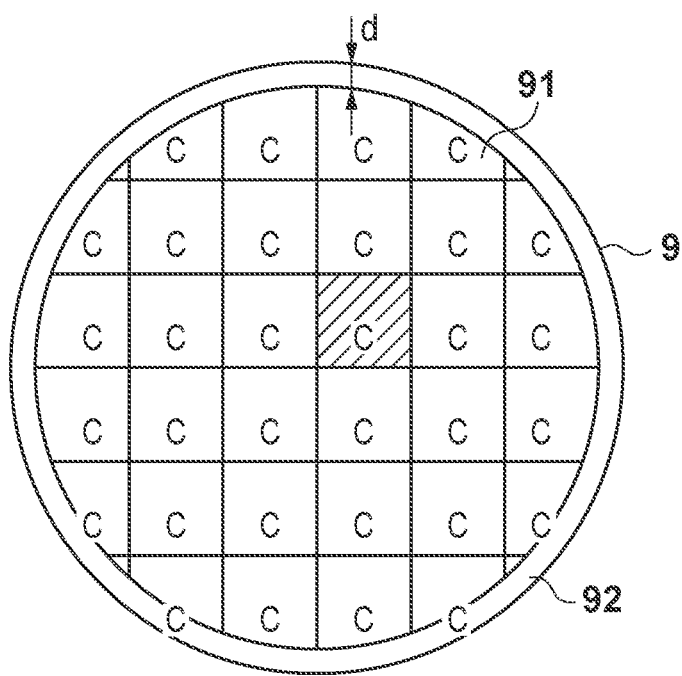
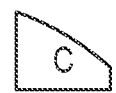

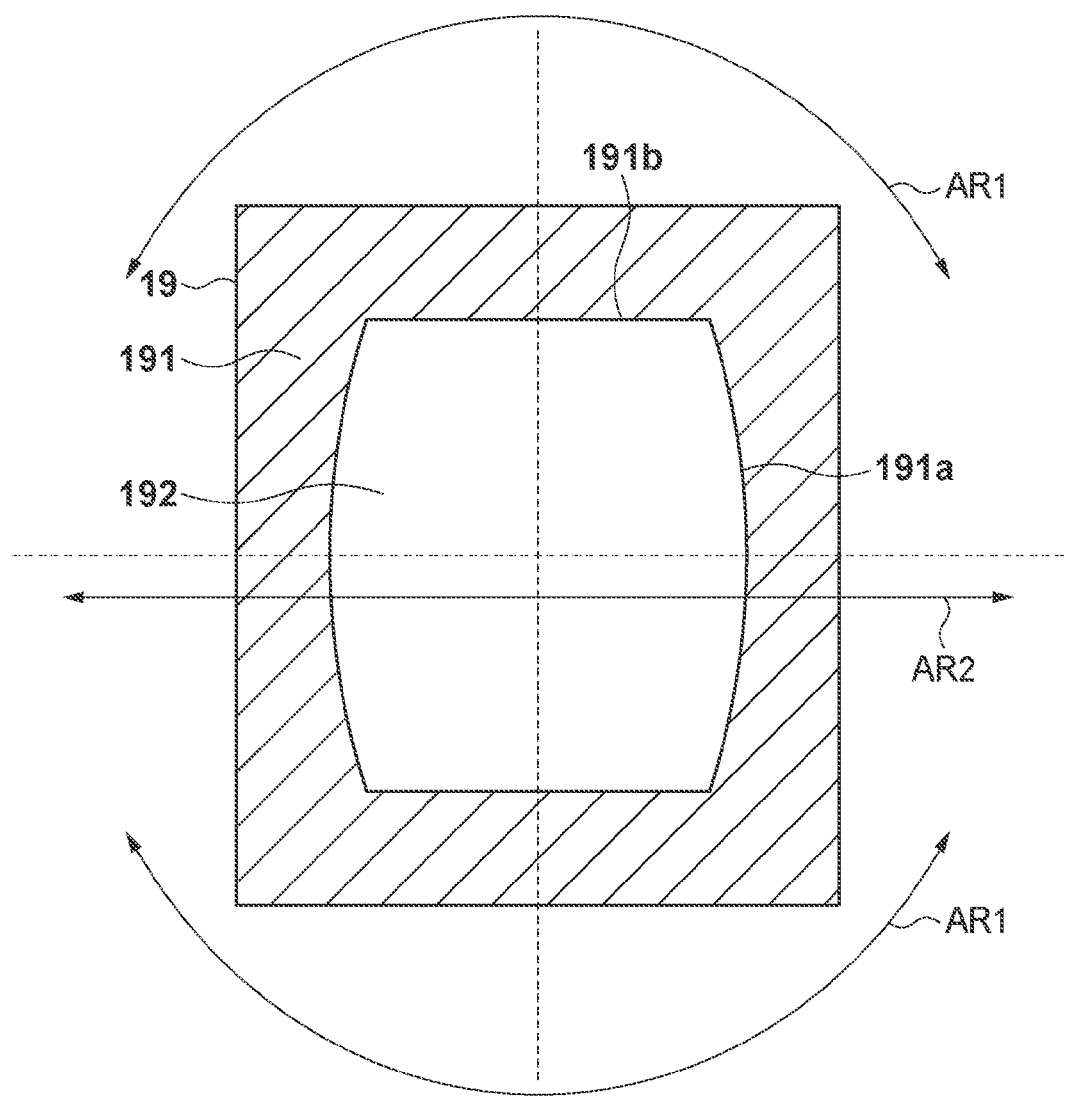

F I G. 7
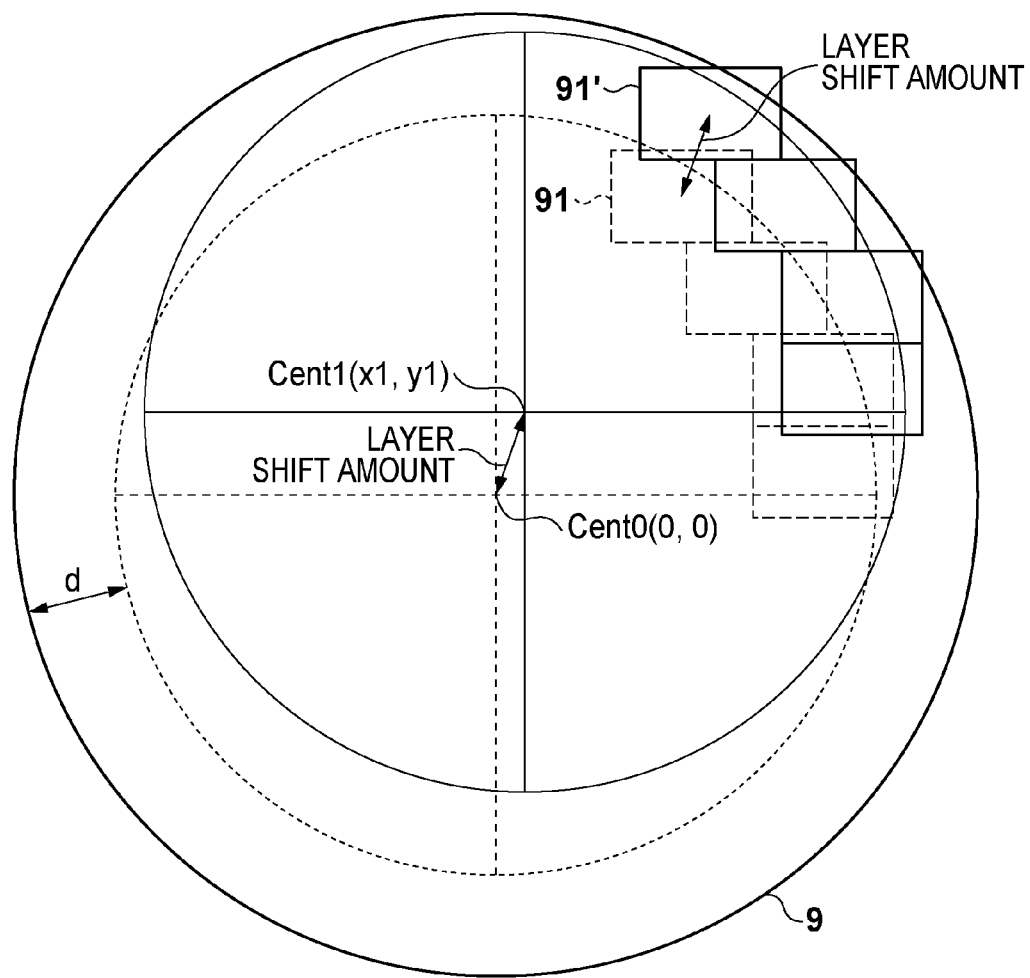

FIG. 17A
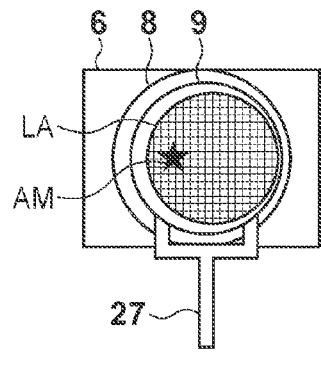
FIG. 17B
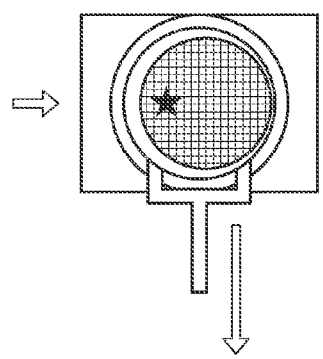
FIG. 17C
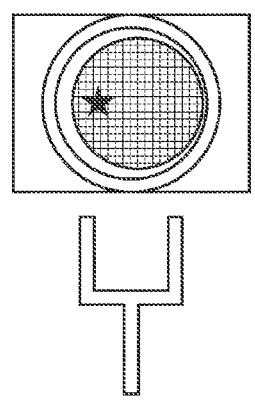
FIG. 17D
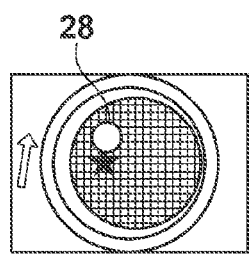
FIG. 17E
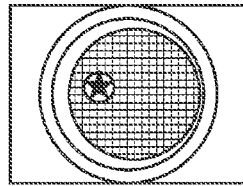
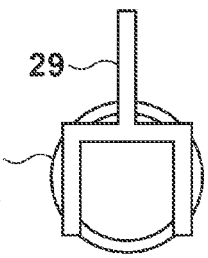
FIG. 17F
FIG. 17G
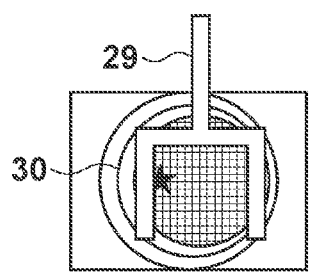

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

In recent years, a semiconductor device is increasingly packaged by flip-chip packaging. A process which fabricates a semiconductor device and copes with flip-chip packaging includes a process of forming a solder ball on a device. As a method of forming a solder ball, a plating method is known. In the method of forming a solder ball by plating, to bring a conductive film formed on a wafer (substrate) into contact with the electrode of a plating device (to electrically connect the conductive film to the electrode), it is necessary to peel off a portion, to be brought into contact with the electrode, in a resist formed on the conductive film. When the resist used is a negative resist, it is only necessary to prevent light from impinging on the peripheral portion of the wafer during exposure (that is, to shield the peripheral portion of the wafer against light). To do this, U.S. Pat. No. 6,680,774, for example, proposes a technique of placing a light shielding plate on the wafer during exposure.

Also, Japanese Patent Laid-Open No. 2005-286062 proposes an imprint apparatus which irradiates a resist on a wafer that is in contact with a mold with ultraviolet rays to transfer the pattern of the mold onto the resist. To define an irradiation region corresponding to each shot region on the peripheral portion of the wafer, Japanese Patent Laid-Open No. 2005-286062 discloses a technique of driving in the X- and Y-axis directions four light shielding plates having arcs corresponding to the contours of the wafer in the first to fourth quadrants, respectively.

As described in U.S. Pat. No. 6,680,774, when a light shielding plate is placed on the wafer, it must be retracted for every wafer replacement, thus imposing constraints in terms of space and throughput. Hence, a technique of placing a light shielding plate not on the wafer but on a plane optically conjugate to the wafer to have it shield the outer peripheral region of the wafer is available. In such a technique, a light shielding plate is positioned so that the distance from the outer periphery of the wafer to the boundary of the outer peripheral region stays constant (that is, the outer peripheral region shifted inward from the outer periphery of the wafer by a predetermined width is shielded against light), based on the position of each outer peripheral shot region on the wafer.

However, the wafer center position with reference to the outer shape of the wafer does not always coincide with the layout center position of an array (layout) of shot regions on a layer (underlying layer) formed on the wafer. When the wafer center position is shifted from the layout center position, but nonetheless the light shielding plate is positioned based on the position of each outer peripheral shot region on the wafer, the light shielding plate is positioned with an offset corresponding to the distance (shift amount) between the wafer center position and the layout center position. As a result, the distance from the outer periphery of the wafer to the boundary of the outer peripheral region varies in each individual outer peripheral shot region, so the width of the outer peripheral region shielded by the light shielding plate cannot be maintained constant.

SUMMARY OF THE INVENTION

The present invention provides a technique which can shield light incident on the outer peripheral region shifted inward from the outer periphery of a substrate by a predetermined width even if the center position of the substrate is shifted from that of an array of shot regions.

According to one aspect of the present invention, there is provided an exposure apparatus including an illumination optical system configured to illuminate a reticle with light from a light source, a projection optical system configured to project a pattern of the reticle onto a substrate, a light shielding plate which is placed on a plane conjugate to an object plane of the projection optical system in the illumination optical system, includes, on an edge thereof, an arc that overlaps a circular boundary line inside an outer periphery of the substrate, and is configured to define a region on the substrate, to which the pattern is to be transferred, a driving unit configured to drive the light shielding plate in an outer peripheral shot region on the substrate, a detection unit configured to detect a shift amount between the center position of the substrate and the center position of an array of a plurality of shot regions on a layer formed on the substrate, and a control unit configured to, in exposing the outer peripheral shot region, perform first control in which the control unit controls the driving unit so that the light shielding plate is positioned at a position, at which the light shielding plate shields light incident on an outer peripheral region shifted inward from the outer periphery of the substrate by a predetermined width, based on the shift amount detected by the detection unit.

Further features of the present invention will become apparent from the following description of exemplary embodiments with reference to the attached drawings.

BRIEF DESCRIPTION OF THE DRAWINGS

FIGS. 3A and 3B are views for explaining a transfer region on a substrate.

FIG. 4 is a view illustrating an example of the configuration of a light shielding plate placed in the illumination optical system of the exposure apparatus shown in FIG. 1.

FIG. 7 is a view for explaining how to position the light shielding plate when a layer is formed on the substrate.

FIGS. 17A to 17G are views for explaining a method of placing a ring-shaped light shielding plate on the substrate to shield light incident on an outer peripheral region shifted inward from the outer periphery of the substrate by a predetermined width.

DESCRIPTION OF THE EMBODIMENTS

Figure 1:
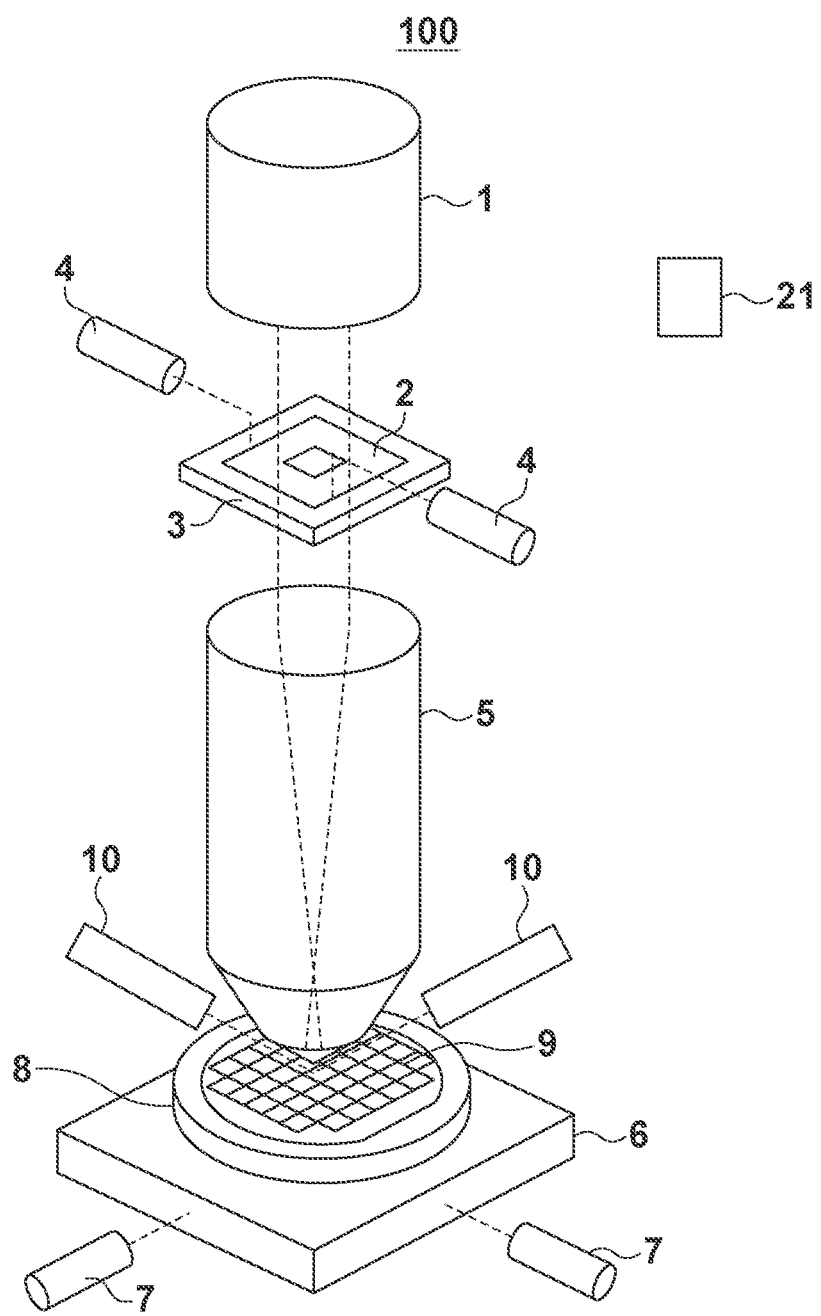
FIG. 1 is a view showing the configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a view showing the configuration of an exposure apparatus 100 according to an aspect of the present invention. The exposure apparatus 100 is a lithography apparatus which projects and transfers the pattern of a reticle (mask) onto a substrate (each shot region on the substrate) by a projection optical system.

The exposure apparatus 100 includes an illumination optical system 1 which illuminates a reticle 2 with light from a light source 11, a reticle stage 3 which holds and moves the reticle 2 having a pattern (circuit pattern) to be transferred onto a substrate (wafer) 9, and an alignment detection unit 4, as shown in FIG. 1. The alignment detection unit 4 detects the position of the reticle 2 held by the reticle stage 3, and that of an alignment mark on the substrate 9 through a projection optical system 5. In this embodiment, the alignment detection unit 4 has both a function of detecting the position of the reticle 2 held by the reticle stage 3, and that of detecting the position of the alignment mark on the substrate 9. However, a reticle alignment detection unit which detects the position of the reticle 2 held by the reticle stage 3, and a substrate alignment detection unit which detects the position of the alignment mark on the substrate 9 may be separately arranged.

The exposure apparatus 100 also includes the projection optical system 5 which projects the pattern of the reticle 2 onto the substrate 9, a substrate stage 6 which holds and moves the substrate 9 (which moves the substrate 9 at least in the X- and Y-axis directions within an X-Y plane), and a laser interferometer 7 which measures the position of the substrate stage 6. The exposure apparatus 100 moreover includes a chuck 8 which absorbs (holds) the substrate 9, and a Z-axis moving mechanism (not shown) which is placed below the chuck 8 and moves the substrate 9 in the Z-axis direction (vertical direction) (that is, which serves to adjust the focus (performs focusing) during exposure). The exposure apparatus 100 again includes an autofocus unit 10 which measures the position (focal position), in the Z-axis direction, of the substrate 9 held by the substrate stage 6, and a control unit 21 which includes a CPU and memory and controls the overall exposure apparatus 100 (an operation of exposing the substrate 9).

Figure 2:
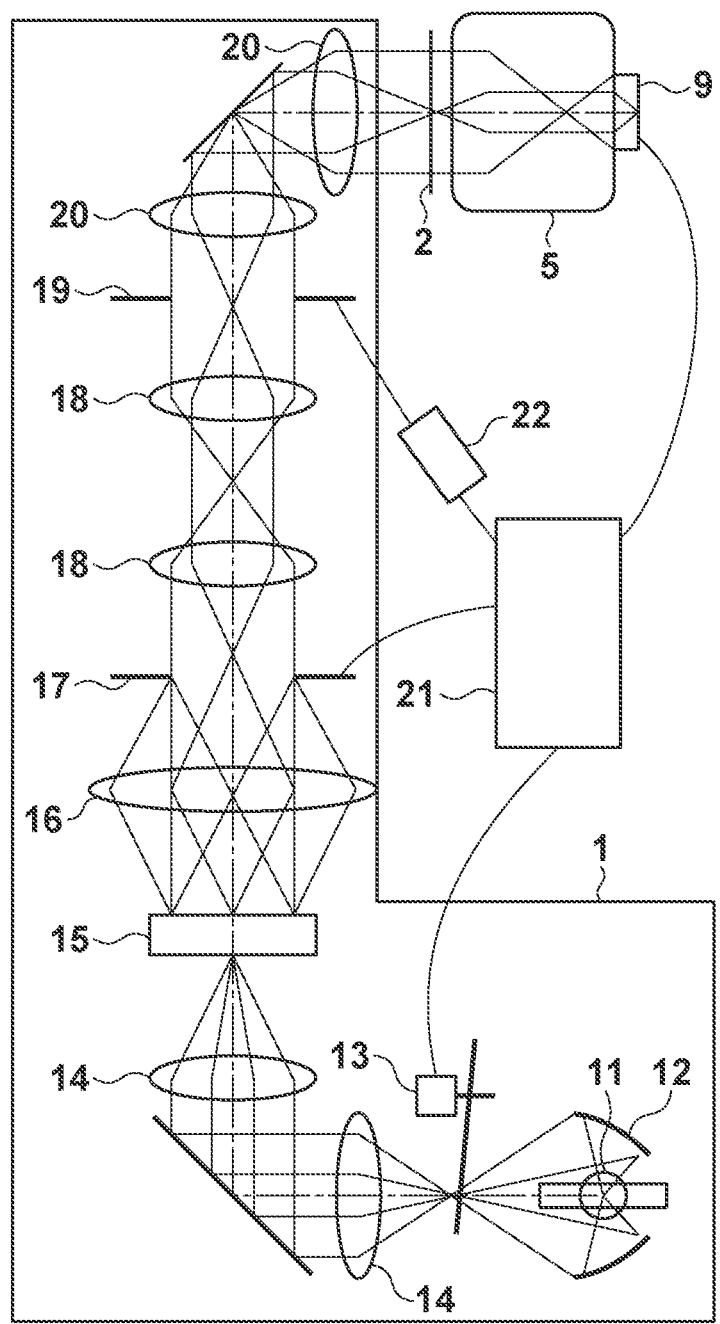
FIG. 2 is a view showing details of the configuration of an illumination optical system in the exposure apparatus shown in FIG. 1.

FIG. 2 is a view showing details of the configuration of the illumination optical system 1. In this embodiment, the illumination optical system 1 includes a light source 11, as shown in FIG. 2. However, the illumination optical system 1 need not always include the light source 11, and the illumination optical system 1 and the light source 11 may be provided separately.

Although the light source 11 uses an ultra-high pressure mercury lamp in this embodiment, it may use an excimer laser (for example, a KrF excimer laser or an ArF excimer laser). A condensing mirror 12 generally uses an elliptical mirror. However, the condensing mirror 12 is not limited to an elliptical mirror, and a facet mirror optimized to increase the collecting power at a focal point may be used. A shutter 13 adjusts the opening/closing time to, in turn, adjust the amount of exposure on the substrate 9 coated with a resist (photosensitive agent), under the control of the control unit 21.

A scaling relay optical system 14 includes a zoom mechanism and changes the light beam diameter in a fly-eye lens 15. In the exposure apparatus 100, to optimize the imaging performance of the projection optical system 5 in accordance with the pattern to be transferred onto the substrate 9, it is necessary to change the coherence factor ($\sigma$ value) expressed as (the NA (Numerical Aperture) of the illumination optical system 1)/(the NA of the projection optical system 5). In this embodiment, the $\sigma$ value can be changed by changing the light beam diameter in the fly-eye lens 15 which determines the NA of the illumination optical system 1.

The fly-eye lens 15 splits the wavefront of a light beam incident on the incident surface to generate secondary light sources on the exit surface. The fly-eye lens 15 can be substituted with a cylindrical lens array. A condenser optical system 16 superposes the light, wavefront-split by the fly-eye lens 15, on the surface to be illuminated, thereby forming a uniform illuminance distribution on the surface to be illuminated.

A masking blade 17 is placed on the surface to be illuminated of the condenser optical system 16. The masking blade 17 is formed by a stop having a variable aperture, and determines the shape (shot shape) of one shot region, to which the exposure apparatus 100 repeatedly transfers the pattern by the step-and-repeat scheme, under the control of the control unit 21. In other words, the masking blade 17 shields light incident on a region outside a rectilinear side which defines the outer edge of each shot region on the substrate 9.

A relay optical system 18 projects an illuminance distribution formed at the position of the masking blade 17 onto a light shielding plate 19. Also, a relay optical system 20 projects an illuminance distribution formed at the position of the light shielding plate 19 onto the reticle 2.

When the exposure apparatus 100 repeatedly exposes the substrate 9 by the step-and-repeat scheme, the light shielding plate 19 can change the shape of a region, to which the pattern is to be transferred, in accordance with the exposure position on the substrate 9. The light shielding plate 19 is placed on a plane conjugate to the object plane of the projection optical system 5 in the illumination optical system 1, includes, on its edge, an arc which overlaps a circular boundary line inside the outer periphery of the substrate 9, and defines a region on the substrate 9, to which the pattern is to be transferred. The light shielding plate 19 is driven within each outer peripheral shot region on the substrate 9 through a driving unit 22. For example, the driving unit 22 rotates the light shielding plate 19 about an axis parallel to the optical axis of the illumination optical system 1 or rectilinearly moves the light shielding plate 19 within a plane perpendicular to the optical axis of the illumination optical system 1, under the control of the control unit 21. Note that in this embodiment, the masking blade 17 and the light shielding plate 19 are arranged at different, optically conjugate positions in the illumination optical system 1 through the relay optical system 18, for the sake of convenience of arrangement.

The light shielding plate 19 will be described in more detail below. FIG. 3A is a view for explaining a transfer region on the substrate 9 and shows the substrate 9 when viewed from the top. Although a silicon substrate is typically used as the substrate 9, a glass substrate, a sapphire substrate, or a substrate made of a compound is also sometimes used. A region to which the exposure apparatus 100 can transfer the pattern by one-time exposure is determined depending on the imaging region of the projection optical system 5, and generally has a size smaller than that of the substrate 9. Hence, the exposure apparatus 100 employs an exposure scheme which is called the step-and-repeat scheme and in which the exposure apparatus 100 repeats transfer of the pattern (exposure on the substrate 9) while moving the substrate 9 step by step. Referring to FIG. 3A, a hatched region indicates a shot region to which the pattern is transferred by one-time exposure, and the same pattern "C" can be transferred onto the entire substrate 9 by repeatedly exposing a plurality of shot regions while moving the substrate 9 step by step.

As described above, in a process of forming a solder ball, a region in which the resist is peeled off must be present on the substrate 9 so that the conductive film on the substrate 9 is brought into contact with (electrically connected to) the electrode of the plating device. This region corresponds to the peripheral portion of the substrate 9, that is, an outer peripheral region 92 shifted inward from the outer periphery of the substrate 9 by a predetermined width (a predetermined width d in this embodiment), as shown in FIG. 3A. When the resist applied on the substrate 9 is a negative resist, the outer peripheral region 92 on the substrate 9 must be shielded against light during exposure. In other words, in transferring the pattern to an outer peripheral shot region 91 on the substrate 9, the outer peripheral shot region 91 must be defined to conform to a transfer region, as shown in FIG. 3B, and be exposed.

FIG. 4 is a view illustrating an example of the configuration of the light shielding plate 19 for defining the outer peripheral shot region 91 to conform to a transfer region, as shown in FIG. 3B, and shows the light shielding plate 19 when viewed from the optical axis direction of the illumination optical system 1. The light shielding plate 19 is formed by a light shielding portion 191 which shields exposure light, and an opening portion 192 which passes the exposure light. The light shielding portion 191 includes an arcuated edge 191a having almost the same arcuated shape as that of the outer periphery of the substrate 9, and a rectilinear edge 191b which has a rectilinear shape and does not directly contribute to shielding the outer peripheral region 92 on the substrate 9 against light. However, the light shielding plate 19 is not limited to the configuration shown in FIG. 4, and may be formed by a light shielding portion including a perfectly circular edge, or a light shielding portion including a circular edge only in one portion. This is because with the latter two configurations, the driving unit 22 can rotate the light shielding plate 19 in rotation directions (double-headed arrows AR1) having the optical axis of the illumination optical system 1 as a center, or rectilinearly move the light shielding plate 19 in directions (double-headed arrow AR2) parallel to a straight line which connects the vertices of the arcuated edge 191a.

Figure 5:
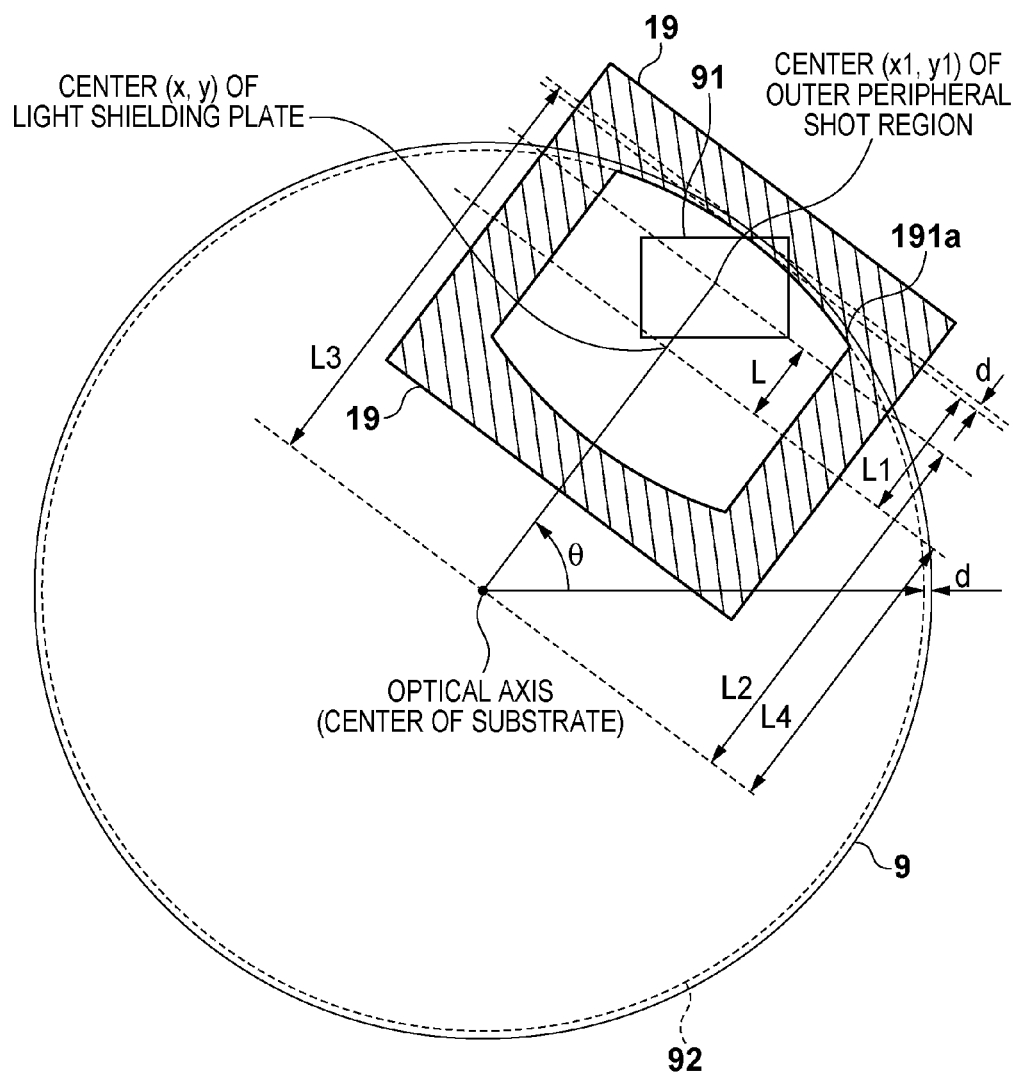
FIG. 5 is a view for explaining how to position the light shielding plate placed in the illumination optical system of the exposure apparatus shown in FIG. 1.

FIG. 5 is a view for explaining how to position the light shielding plate 19 by the driving unit 22 under the control of the control unit 21, and shows the positional relationship between the light shielding plate 19 and the outer peripheral shot region 91 on the substrate 9. In exposing the outer peripheral shot region 91, the light shielding plate 19 is positioned at a position at which it shields exposure light incident on the outer peripheral region 92 shifted inward from the outer periphery of the substrate 9 by the width d, as shown in FIG. 5. More specifically, the light shielding plate 19 is rotated through θ about the optical axis of the illumination optical system 1 as a center, and is positioned so that the center (x, y) of the light shielding plate 19 is set at a position shifted (obtained by rectilinearly moving it) by L from the center (x1, y1) of the outer peripheral shot region 91 toward the center of the substrate 9.

Note that L is the amount of rectilinear movement of the light shielding plate 19 and is given using numerical values shown in FIG. 5 as:

$$L = \sqrt{(x1-x)^2 + (y1-y)^2} \quad (1)$$
$$= L2 - L4$$
$$= L2 - \{L3 - (L1+d)\}$$

where d is the width of the outer peripheral region 92, θ is the amount of rotation of the light shielding plate 19 (that is, the angle that a horizontal line on the substrate 9 makes with a straight line which connects the optical axis of the illumination optical system 1 (the center of the substrate 9) to the center of the outer peripheral shot region 91, L is the amount of rectilinear movement of the light shielding plate 19, L1 is the distance from the center of the light shielding plate 19 to the arcuated edge 191a of the light shielding plate 19, L2 is the distance from the center of the substrate 9 to that of the outer peripheral shot region 91, L3 is the distance from the center of the substrate 9 to the outer periphery of the substrate 9 (that is, the radius of the substrate 9), and L4 is the distance from the center of the substrate 9 to that of the light shielding plate 19.

Figure 6:
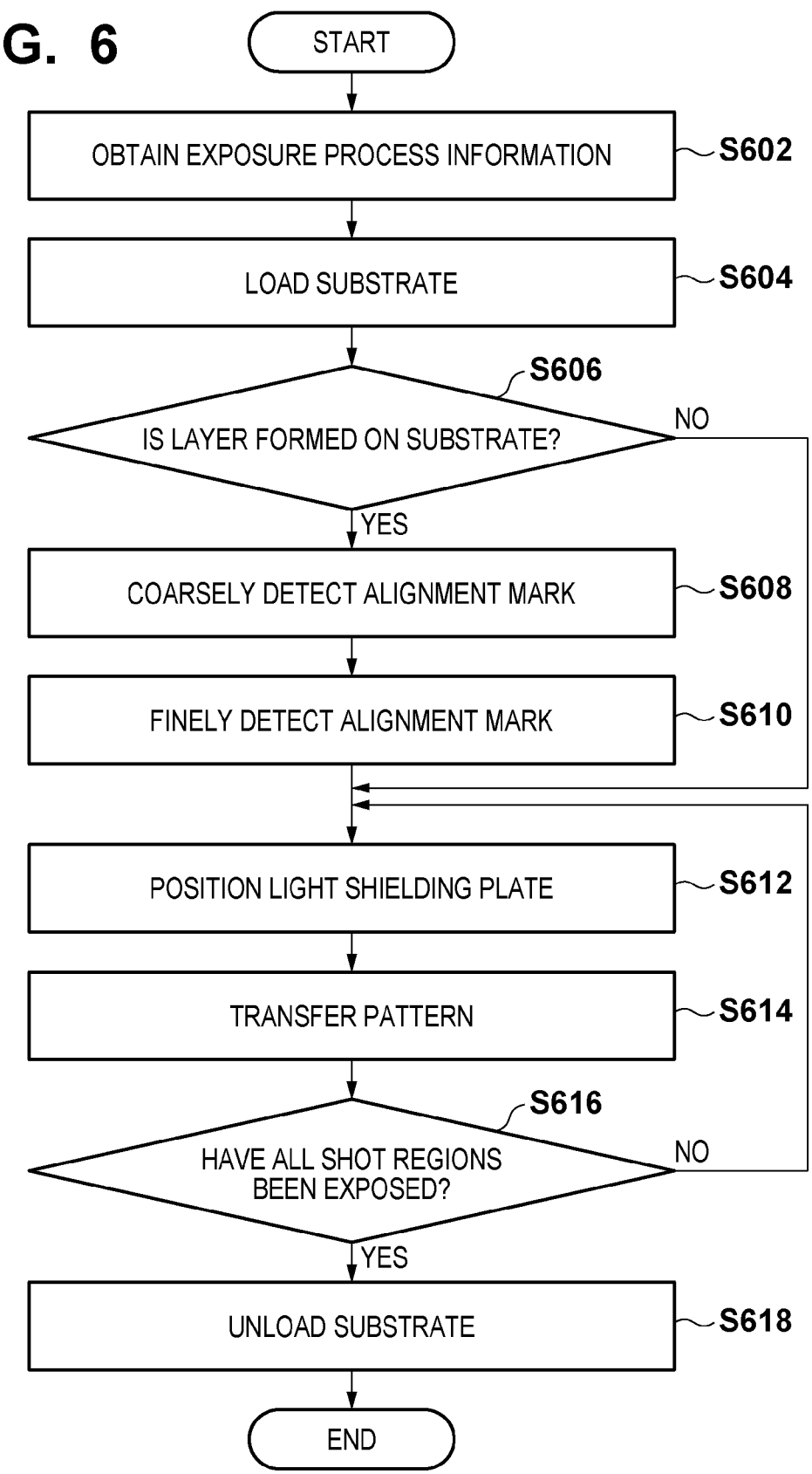
FIG. 6 is a flowchart for explaining an exposure process by the exposure apparatus shown in FIG. 1.

An exposure process by the exposure apparatus 100 will be described with reference to FIG. 6. The control unit 21 systematically controls each unit of the exposure apparatus 100 to perform this exposure process. An exposure process on one substrate 9 will be taken as an example herein.

In step S602, exposure process information associated with an exposure process on the substrate 9 (that is, information necessary to expose the substrate 9) is obtained. The exposure process information includes not only, for example, the exposure conditions but also information necessary to position (control) the light shielding plate 19. The exposure process information includes, for example, sequence information indicating whether a layer (underlying layer) is formed on the substrate 9 to undergo an exposure process (that is, whether the current sequence is a first or second sequence), and layout information indicating an array of a plurality of shot regions on the substrate 9. The exposure process information may also include, for example, a substrate placement offset indicating the shift amount between the center of the substrate 9 and that of the substrate stage 6, which is generated upon placement of the substrate 9 on the substrate stage 6, and light shielding plate control mode information indicating the control mode of the light shielding plate 19 in exposing the outer peripheral shot region 91.

In step S604, the substrate 9 to undergo an exposure process is loaded into the exposure apparatus 100 and placed on the substrate stage 6 through a substrate transport robot. At this time, the substrate 9 is held on the substrate stage 6 so that the center of the substrate 9 coincides with that of the substrate stage 6, in consideration of the substrate placement offset included in the exposure process information.

In step S606, it is determined whether a layer is formed on the substrate 9 to undergo an exposure process, based on the sequence information included in the exposure process information obtained in step S602. If no layer is formed on the substrate 9, the process directly advances to step S612. However, if a layer is formed on the substrate 9, the process advances to step S608.

In step S608, an alignment mark on the layer formed on the substrate 9 is detected (coarsely detected) by the alignment detection unit 4 (that is, prealignment is performed). In step S610, the alignment mark on the layer formed on the substrate 9 is precisely detected (finely detected) by the alignment detection unit 4, based on the detection result obtained in step S608. The shift amount between the center position of the substrate 9 (substrate center position) corresponding to the center position of the substrate stage 6 and that of an array of a plurality of shot regions in the layer formed on the substrate 9 (layer center position) can be obtained from the detection results obtained in steps S608 and S610, as will be described later.

In step S612, the light shielding plate 19 is driven by the driving unit 22 and positioned. More specifically, if no layer is formed on the substrate 9 to undergo an exposure process, the light shielding plate 19 is positioned, as described with reference to FIG. 5, based on the layout information included in the exposure process information obtained in step S602. However, if a layer is formed on the substrate 9 to undergo an exposure process, the light shielding plate 19 is positioned based on the layout information included in the exposure process information obtained in step S602, and the shift amount between the substrate center position and the layer center position obtained from the detection results obtained in steps S608 and S610. However, the light shielding plate 19 is used to shield exposure light incident on the outer peripheral region 92 in exposing the outer peripheral shot region 91 on the substrate 9, as described above. Therefore, if the target shot region (a shot region to which the pattern is to be transferred next) is not the outer peripheral shot region 91, the light shielding plate 19 need only be retracted from the optical path of the illumination optical system 1 and need not be positioned. Also, the light shielding plate 19 can be positioned while the substrate stage 6 is moved to position the target shot region on the substrate 9 at the exposure position.

In step S614, the target shot region on the substrate 9 is exposed to transfer the pattern of the reticle 2 to this target shot region.

In step S616, it is determined whether all shot regions on the substrate 9 held by the substrate stage 6 have been exposed (that is, the pattern has been transferred to all shot regions). If not all shot regions on the substrate 9 have been exposed, the next region is set as the target shot region, and the process returns to step S612. However, if all shot regions on the substrate 9 have been exposed, the process advances to step S614.

In step S618, the substrate 9 having all its shot regions exposed is recovered and unloaded from the exposure apparatus 100 through the substrate transport robot.

Positioning (step S612) of the light shielding plate 19 when a layer is formed on the substrate 9 to undergo an exposure process will be explained herein. FIG. 7 is a view showing the substrate 9 when the substrate stage 6 holds the substrate 9 so that the center of the substrate 9 coincides with that of the substrate stage 6, and the substrate center position of the substrate 9 held by the substrate stage 6 is shifted from (does not coincides with) the layer center position. FIG. 7 shows, using dotted lines, outer peripheral shot regions 91 when the substrate center position coincides with the layer center position, and shows, using solid lines, outer peripheral shot regions 91' when the substrate center position is shifted from the layer center position.

Referring to FIG. 7, from the layout information included in the exposure process information, and the detection result obtained by the alignment detection unit 4, the shift amount (layer shift amount) between the substrate center position Cent(0, 0) of the substrate 9 and the layer center position Cent1(x1, y1) can be calculated in accordance with:

$$\text{Layout Shift Amount} = \sqrt{(x1-0)^2 + (y1-0)^2} \quad (2)$$

Figure 8:
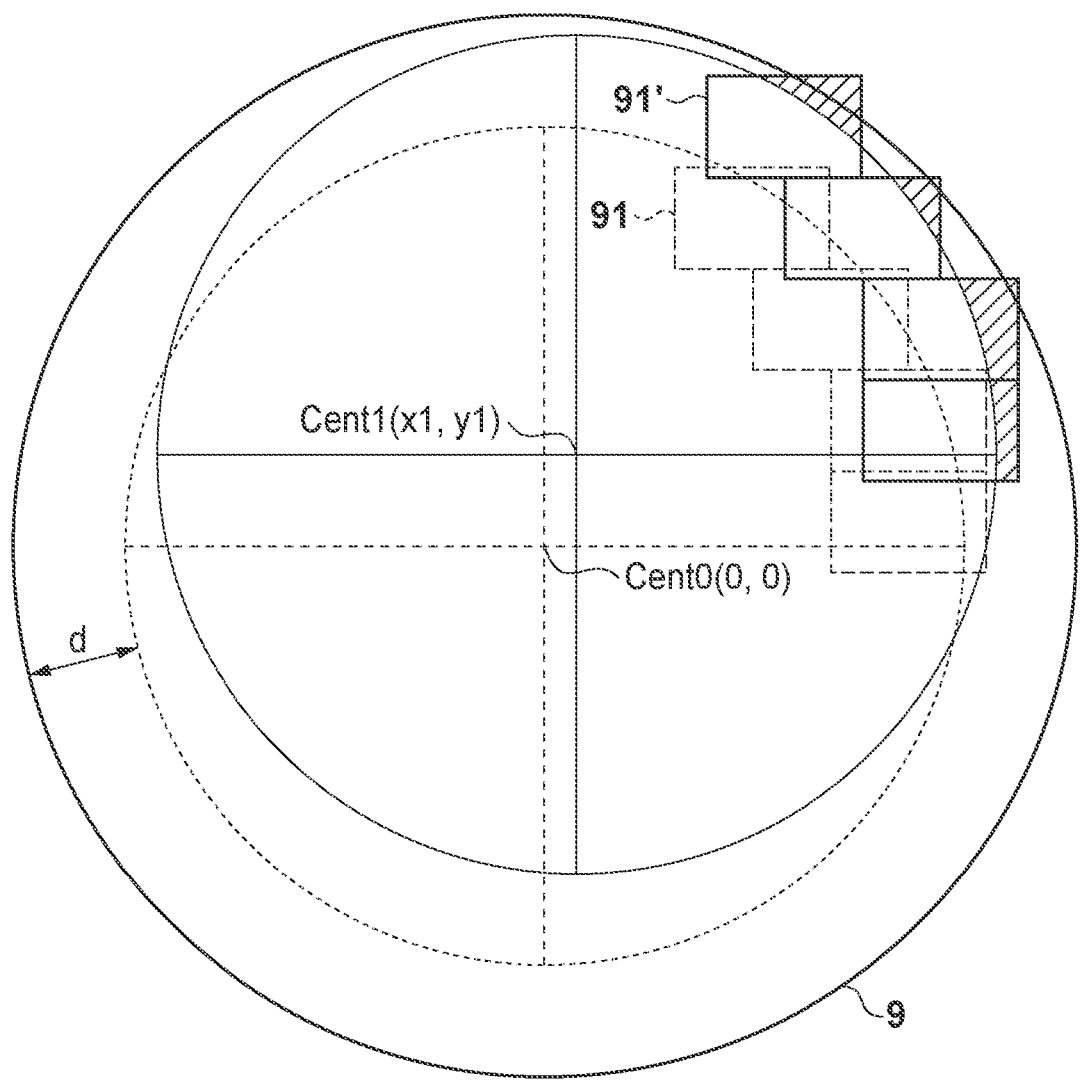
FIG. 8 is a view for explaining how to position the light shielding plate when a layer is formed on the substrate.

When the substrate center position of the substrate 9 is shifted from the layer center position, but nonetheless the light shielding plate 19 is positioned with no concern for the layout shift amount, hatched portions in the outer peripheral shot regions 91' are shielded against light, as shown in FIG. 8. In this embodiment, such a control mode of the light shielding plate 19 will be referred to as a layer reference control mode.

Figure 9:
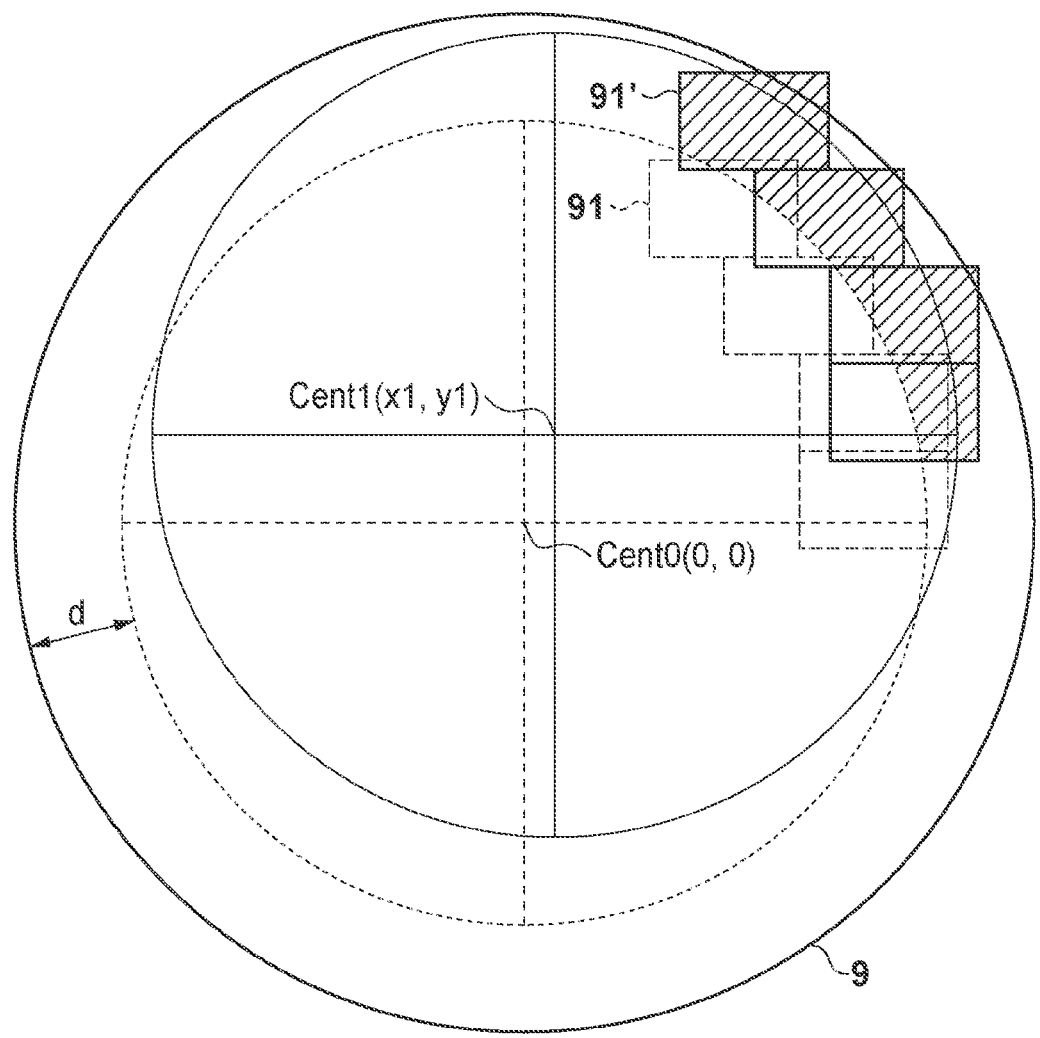
FIG. 9 is a view for explaining how to position the light shielding plate when a layer is formed on the substrate.

On the other hand, when the substrate center position of the substrate 9 is shifted from the layer center position, and therefore the light shielding plate 19 is positioned in consideration of the layer shift amount, hatched portions in the outer peripheral shot regions 91' are shielded against light, as shown in FIG. 9. In this embodiment, such a control mode of the light shielding plate 19 will be referred to as an outer shape reference control mode.

Figure 10:
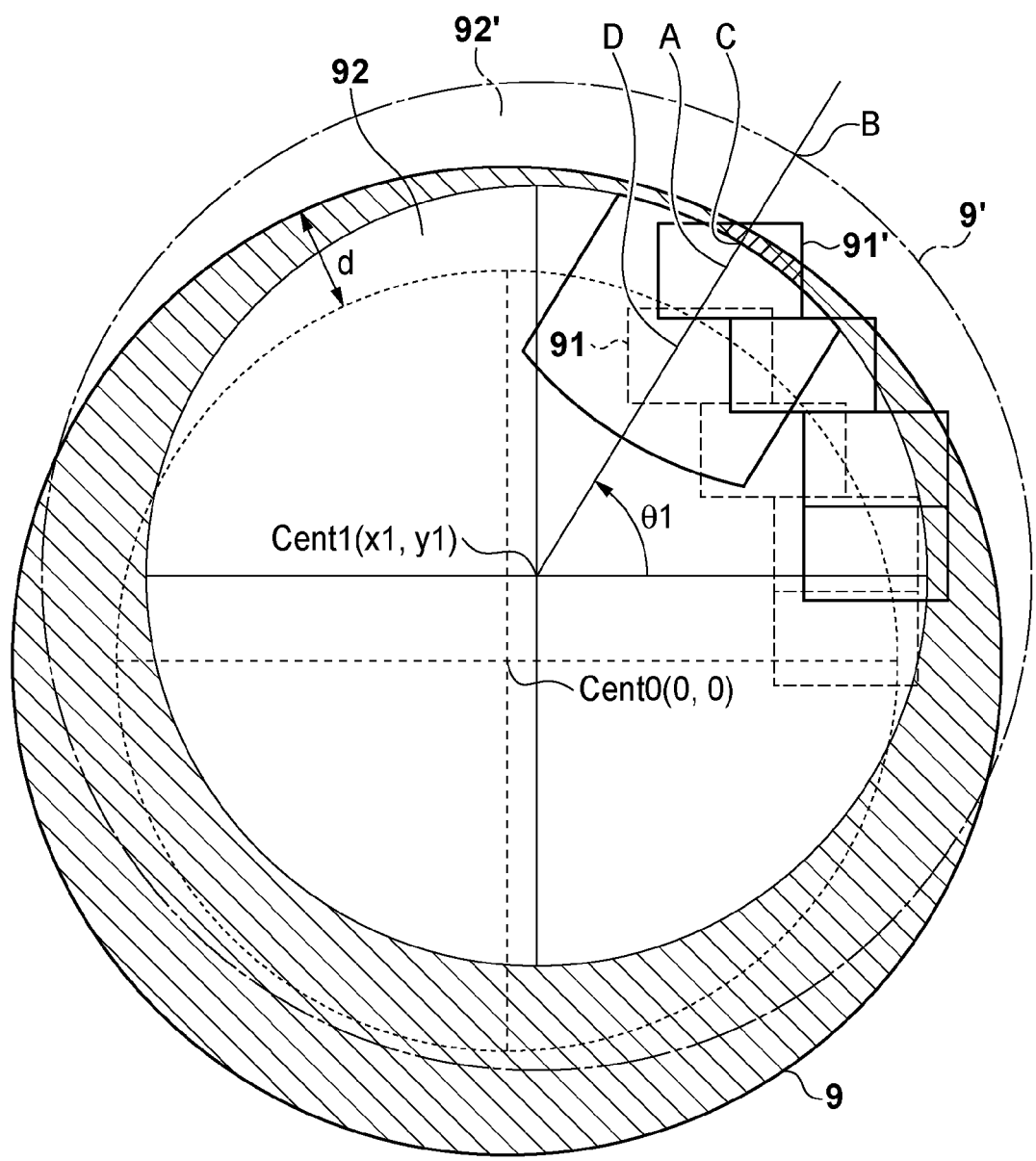
FIG. 10 is a view for explaining details of a layer reference control mode as a light shielding plate control mode.

The amount of rotation of the light shielding plate 19 and that of rectilinear movement of the light shielding plate 19, which are obtained from the positions of the outer peripheral shot regions 91' on the substrate 9, in the layer reference control mode will be described with reference to FIG. 10. Referring to FIG. 10, a circle indicated by an alternate long and short dashed line shows a substrate virtual outer periphery 9' obtained from the position of the outer peripheral shot region 91' on the substrate 9. Also, reference symbol A denotes the center position of the outer peripheral shot region 91' on the substrate 9; and B, the intersection point between the substrate virtual outer periphery 9' and a straight line which connects the layer center position Cent1(x1, y1) to the center position of the outer peripheral shot region 91'. Reference symbol C denotes a position spaced apart from the substrate virtual outer periphery 9' by the distance d (that is, the boundary of a region shielded against light by the light shielding plate 19); and D, the center position of the light shielding plate 19.

Referring to FIG. 10, the distance between the positions B and C corresponds to the width d of an outer peripheral region shifted inward from the substrate virtual outer periphery 9' by a predetermined width. However, a region actually shielded against light by the light shielding plate 19 is a hatched portion, which is different from the outer peripheral region 92 shifted inward from the outer periphery of the substrate 9 by the predetermined width d. The distance between the positions A and D corresponds to the amount of rectilinear movement of the light shielding plate 19 (the amount of rectilinear movement L of the light shielding plate 19 in FIG. 5). Reference symbol θ1 corresponds to the amount of rotation of the light shielding plate 19 (that is, the angle that a horizontal line on the substrate 9 makes with a straight line which connects the layer center to the center of the outer peripheral shot region 91').

In this manner, in the layer reference control mode, the light shielding plate 19 is positioned at a position at which it shields light incident on an outer peripheral region 92' shifted inward by a predetermined width from the substrate virtual outer periphery 9' obtained from the position of the outer peripheral shot region 91'. Therefore, in the layer reference control mode, if the substrate center position of the substrate 9 is shifted from the layer center position, the width of the region (hatched portion) actually shielded against light by the light shielding plate 19 cannot be maintained constant (at the predetermined width d).

Figure 11:
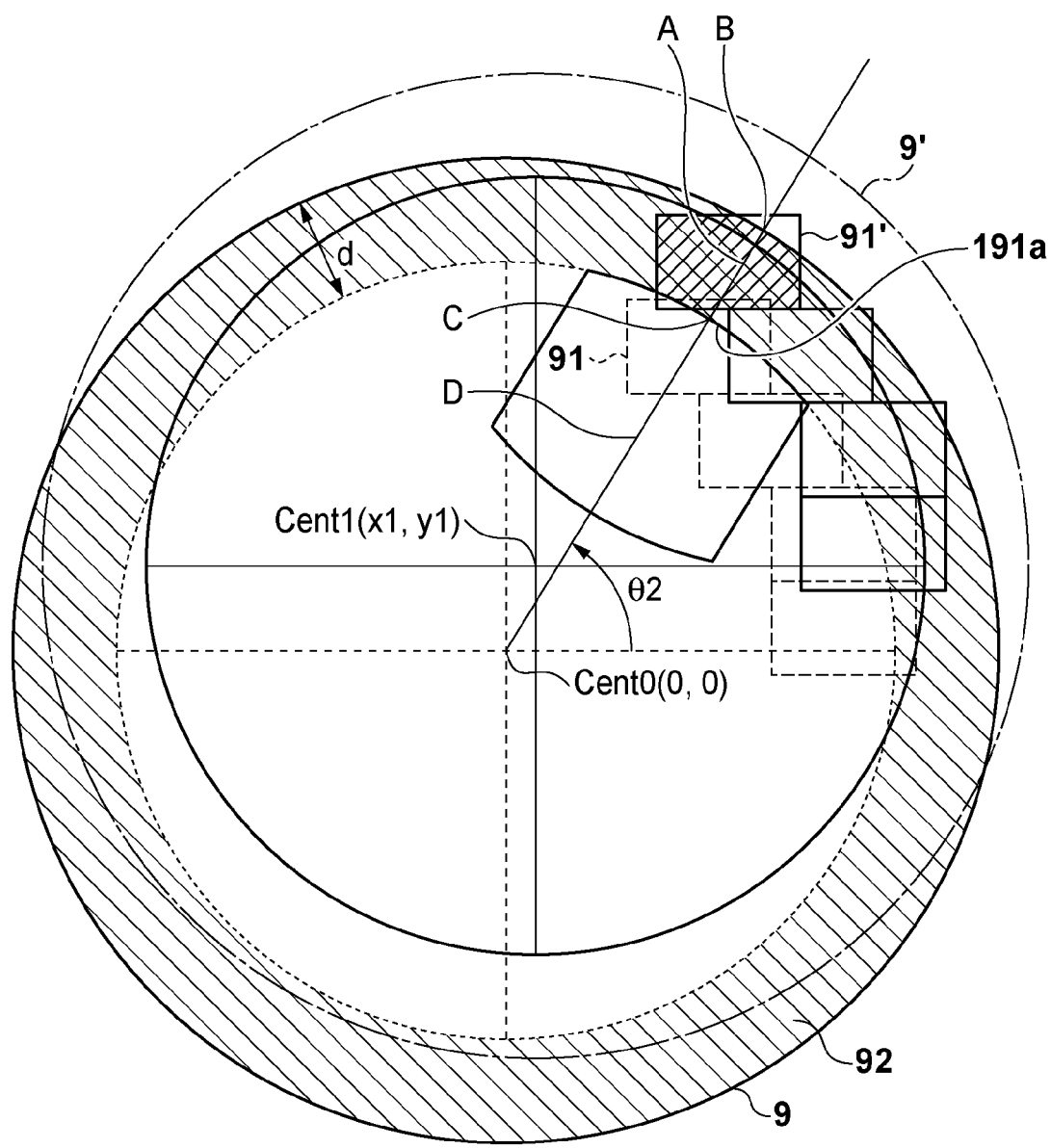
FIG. 11 is a view for explaining details of an outer shape reference control mode as a light shielding plate control mode.

The amount of rotation of the light shielding plate 19 and that of rectilinear movement of the light shielding plate 19, which are obtained in consideration of the layer shift amount, in the outer shape reference control mode will be described with reference to FIG. 11. Referring to FIG. 11, a circle indicated by an alternate long and short dashed line shows a substrate virtual outer periphery 9' obtained from the position of the outer peripheral shot region 91' on the substrate 9. Also, reference symbol A denotes the center position of the outer peripheral shot region 91' on the substrate 9; and B, the intersection point between the outer periphery of the substrate 9 and a straight line which connects the substrate center position Cent(0, 0) to the center position of the outer peripheral shot region 91'. Reference symbol C denotes a position spaced apart from the outer periphery of the substrate 9 by the distance d (that is, the boundary of a region shielded against light by the light shielding plate 19); and D, the center position of the light shielding plate 19.

Referring to FIG. 11, the distance between the positions B and C corresponds to the width d of an outer peripheral region shifted inward from the outer periphery of the substrate 9 by a predetermined width. Therefore, a region actually shielded against light by the light shielding plate 19 is the outer peripheral region 92 which is shifted inward from the outer periphery of the substrate 9 by the predetermined width and is indicated by a hatched portion. The distance between the positions A and D corresponds to the amount of rectilinear movement of the light shielding plate 19 (the amount of rectilinear movement L of the light shielding plate 19 in FIG. 5). Reference symbol $\theta 2$ corresponds to the amount of rotation of the light shielding plate 19 (that is, the angle that a horizontal line on the substrate 9 makes with a straight line which connects the substrate center to the center of the outer peripheral shot region 91'). In this manner, in the outer shape reference control mode, the light shielding plate 19 is positioned at a position at which it shields light incident on the outer peripheral region 92 shifted inward from the outer periphery of the substrate 9 by the predetermined width d, based on the layer shift amount. More specifically, the light shielding plate 19 is positioned so that the arcuated edge 191a projected onto the image plane of the projection optical system 5 is positioned on the circular boundary line of the outer peripheral region 92 shifted inward from the substrate virtual outer periphery 9' obtained from the position of the outer peripheral shot region 91' by a width equal to the sum of the predetermined width and the layout shift amount. Therefore, in the outer shape reference control mode, even if the substrate center position of the substrate 9 is shifted from the layer center position, the width of the region (hatched portion) actually shielded against light by the light shielding plate 19 can be maintained constant (at the predetermined width d).

When the exposure apparatus 100 in this embodiment exposes each outer peripheral shot region on a substrate 9 having a layer formed on it, the light shielding plate 19 is controlled in the outer shape reference control mode (first control). This makes it possible to accurately shield light incident on the outer peripheral region 92 shifted inward from the outer periphery of the substrate 9 by the predetermined width d, as described above. Also, the exposure apparatus 100 in this embodiment does not execute the outer shape reference control mode alone but can selectively execute the outer shape reference control mode and the layer reference control mode (second control). When the exposure apparatus 100 exposes each outer peripheral shot region on the substrate 9 having no layer formed on it, the light shielding plate 19 is controlled in the layer reference control mode because there is no need to take the layer shift amount into consideration. In this case, the position of each outer peripheral shot region cannot be obtained from the detection result obtained by the alignment detection unit 4, and need only be obtained from the layout information. Assume also that the width of the outer peripheral region shielded against light by the light shielding plate 19 is not maintained constant (that is, the layer reference control mode is selected) to give priority to the productivity (yield) of actual chips obtained from the outer peripheral region on the substrate 9. In such a case, it is only necessary to designate the layer reference control mode in the light shielding plate control mode information included in the exposure process information, and control the light shielding plate 19 in the layer reference control mode even when a substrate having a layer formed on it is to be exposed.

Hence, the exposure apparatus 100 according to this embodiment can provide high-quality devices (for example, a semiconductor integrated circuit device and a liquid crystal display device) with a high throughput and good economic efficiency. Note that these devices are fabricated through a step of exposing a substrate (for example, a wafer or a glass plate) coated with a photoresist (photosensitive agent) using the exposure apparatus 100, a step of developing the exposed substrate, and subsequent known steps.

Figure 12:
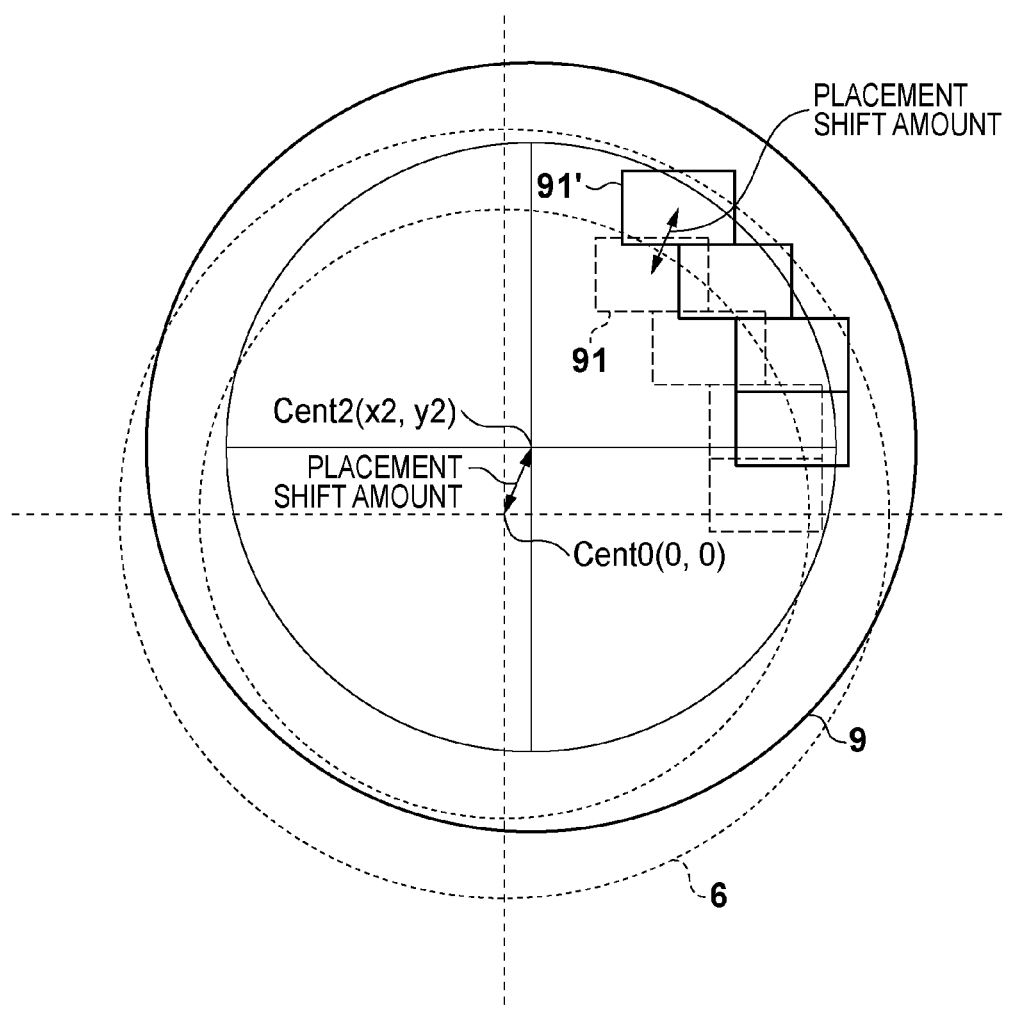
FIG. 12 is a view for explaining how to position the light shielding plate when the center of the substrate held by a substrate stage is shifted from that of the substrate stage.

Note that since the substrate 9 is held on the substrate stage 6 so that the center of the substrate 9 coincides with that of the substrate stage 6, the center of the substrate 9 does not shift from that of the substrate stage 6, as described above. However, as a reference example, assume that the center of the substrate 9 is shifted from (does not coincide with) that of the substrate stage 6. FIG. 12 is a view showing the substrate 9 when the center of the substrate 9 held by the substrate stage 6 is shifted from that of the substrate stage 6, and the substrate center position of the substrate 9 held by the substrate stage 6 coincides with the layer center position. FIG. 12 shows, using dotted lines, outer peripheral shot regions 91 when the center of the substrate 9 coincides with that of the substrate stage 6, and shows, using solid lines, outer peripheral shot regions 91' when the center of the substrate 9 is shifted from that of the substrate stage 6.

Referring to FIG. 12, from the layout information included in the exposure process information, and the detection result obtained by the alignment detection unit 4, the shift amount (placement shift amount) between the substrate center position Cent(0, 0) of the substrate stage 6 and the substrate center position Cent2(x2, y2) can be calculated in accordance with:

$$\text{Arrangement Shift Amount} = \sqrt{(x2-0)^2 + (y2-0)^2} \qquad (3)$$

When the substrate center position coincides with the layer center position, the placement shift amount coincides with the shift amount between the substrate center position and the center position of the substrate stage 6, which is measured and stored as apparatus information in advance.

Figure 13:
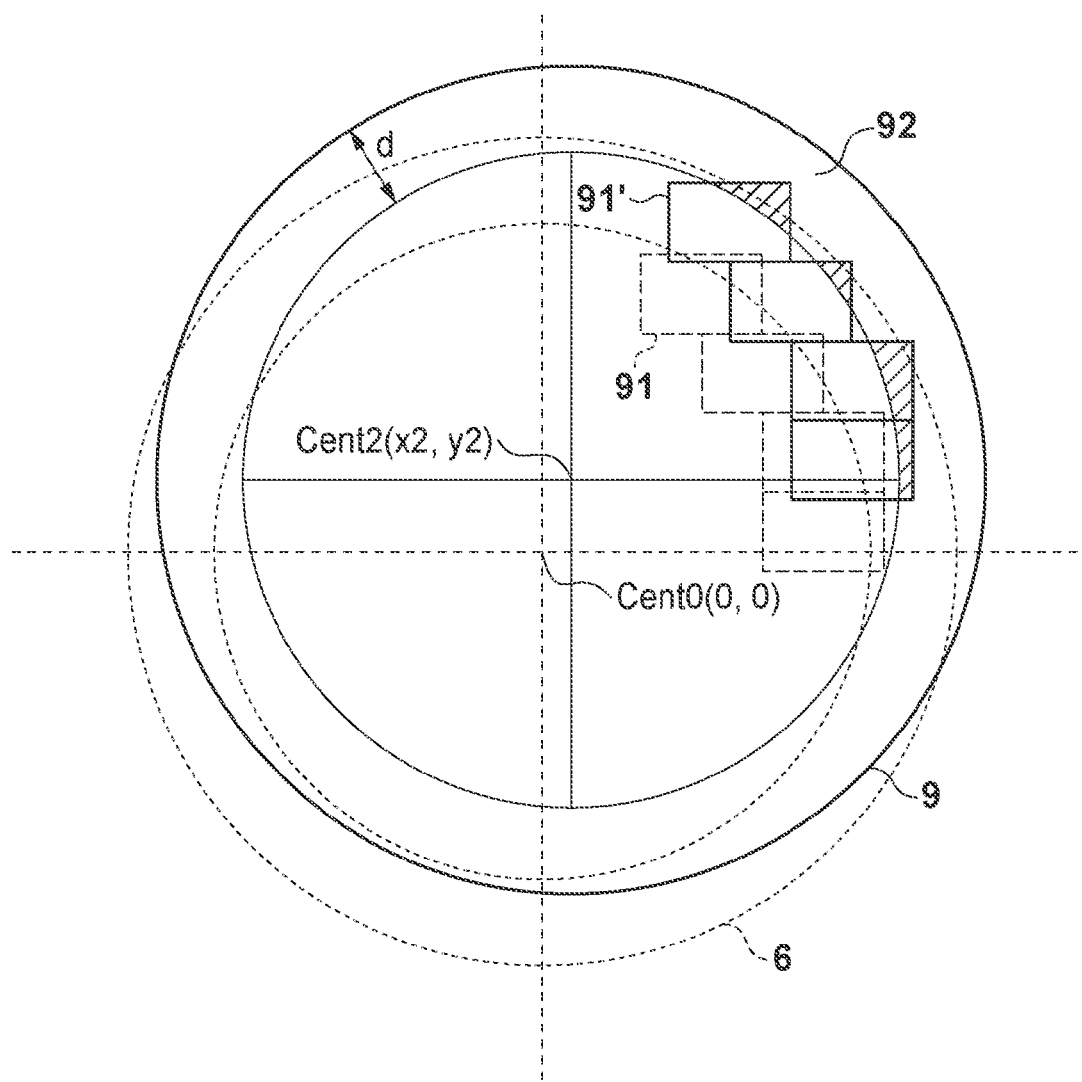
FIG. 13 is a view for explaining how to position the light shielding plate when the center of the substrate held by the substrate stage is shifted from that of the substrate stage.

In a substrate 9 having a layer formed on it, when the center position of the substrate stage 6 is shifted from the substrate center position, but nonetheless the light shielding plate 19 is positioned with no concern for the placement shift amount, hatched portions in the outer peripheral shot regions 91' are shielded against light, as shown in FIG. 13. This makes it possible to accurately shield light incident on the outer peripheral region 92 shifted inward from the outer periphery of the substrate 9 by the predetermined width d. Note that FIG. 13 shows, using dotted lines, outer peripheral shot regions 91 when the center of the substrate 9 coincides with that of the substrate stage 6, and shows, using solid lines, outer peripheral shot regions 91' when the center of the substrate 9 is shifted from that of the substrate stage 6.

Figure 14:
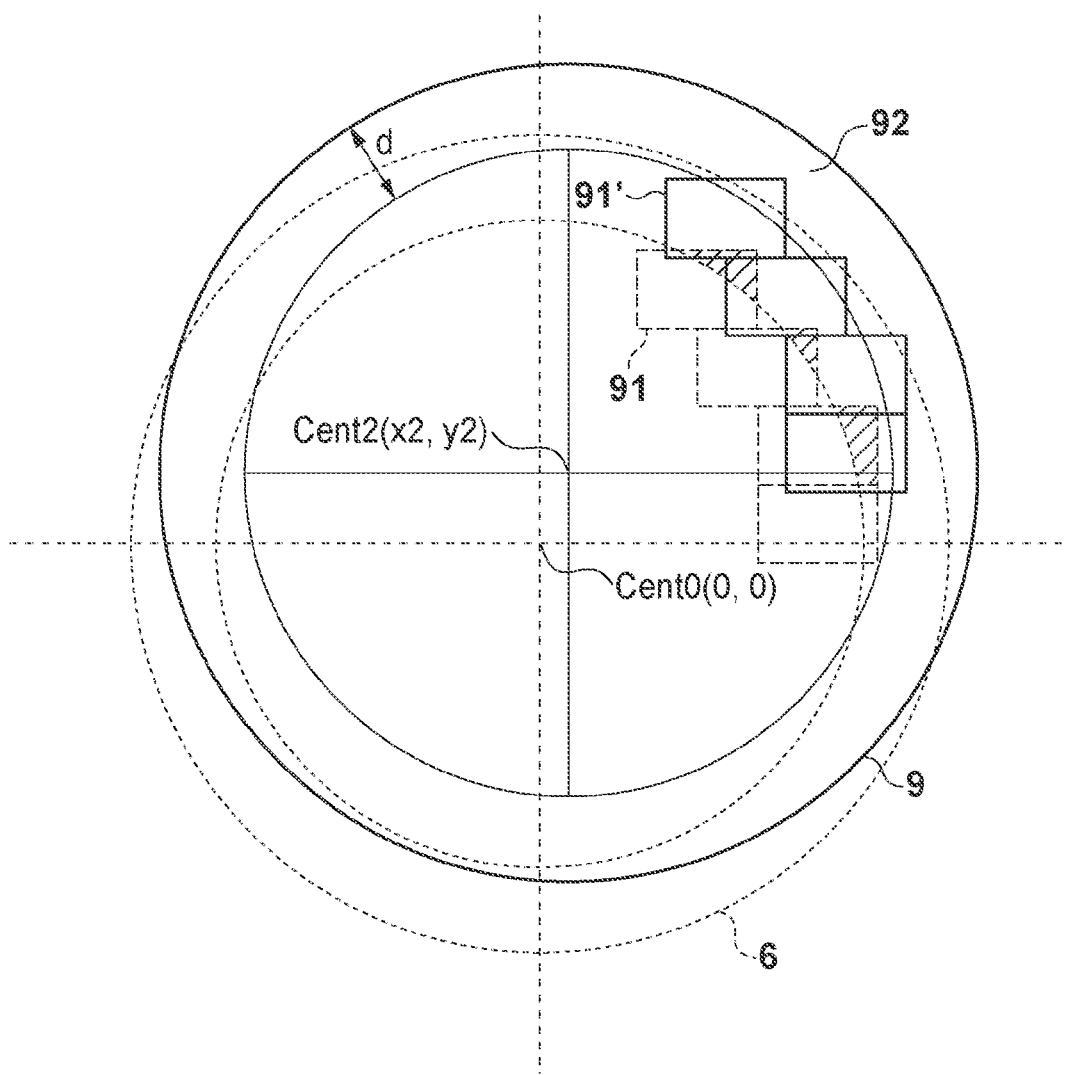
FIG. 14 is a view for explaining how to position the light shielding plate when the center of the substrate held by the substrate stage is shifted from that of the substrate stage.

However, in a substrate 9 having no layer formed on it, when the center position of the substrate stage 6 is shifted from the substrate center position, but nonetheless the light shielding plate 19 is positioned with no concern for the placement shift amount, hatched portions in the outer peripheral shot regions 91' are shielded against light, as shown in FIG. 14. Note that FIG. 14 shows, using dotted lines, outer peripheral shot regions 91 obtained from the layout information when the center of the substrate 9 coincides with that of the substrate stage 6. Also, FIG. 14 shows, using solid lines, outer peripheral shot regions 91' obtained from the layout information when the center of the substrate 9 is shifted from that of the substrate stage 6.

Referring to FIG. 14, if the center of the substrate 9 coincides with that of the substrate stage 6, the light shielding plate 19 accurately shields light incident on the outer peripheral region 92 shifted inward from the outer periphery of the substrate 9 by the predetermined width d. However, if the center of the substrate 9 is shifted from that of the substrate stage 6, the substrate center position (layer center position) shifts by a placement shift amount, so the width of the region (hatched portion) actually shielded against light by the light shielding plate 19 cannot be maintained constant (at the predetermined width d). In such a case, the substrate 9 must be exposed so that the substrate center position coincides with the layer center position, using the substrate placement offset and layout information included in the exposure process information. This makes it possible to accurately shield light incident on the outer peripheral region 92 shifted inward from the outer periphery of the substrate 9 by the predetermined width d.

Figure 15:
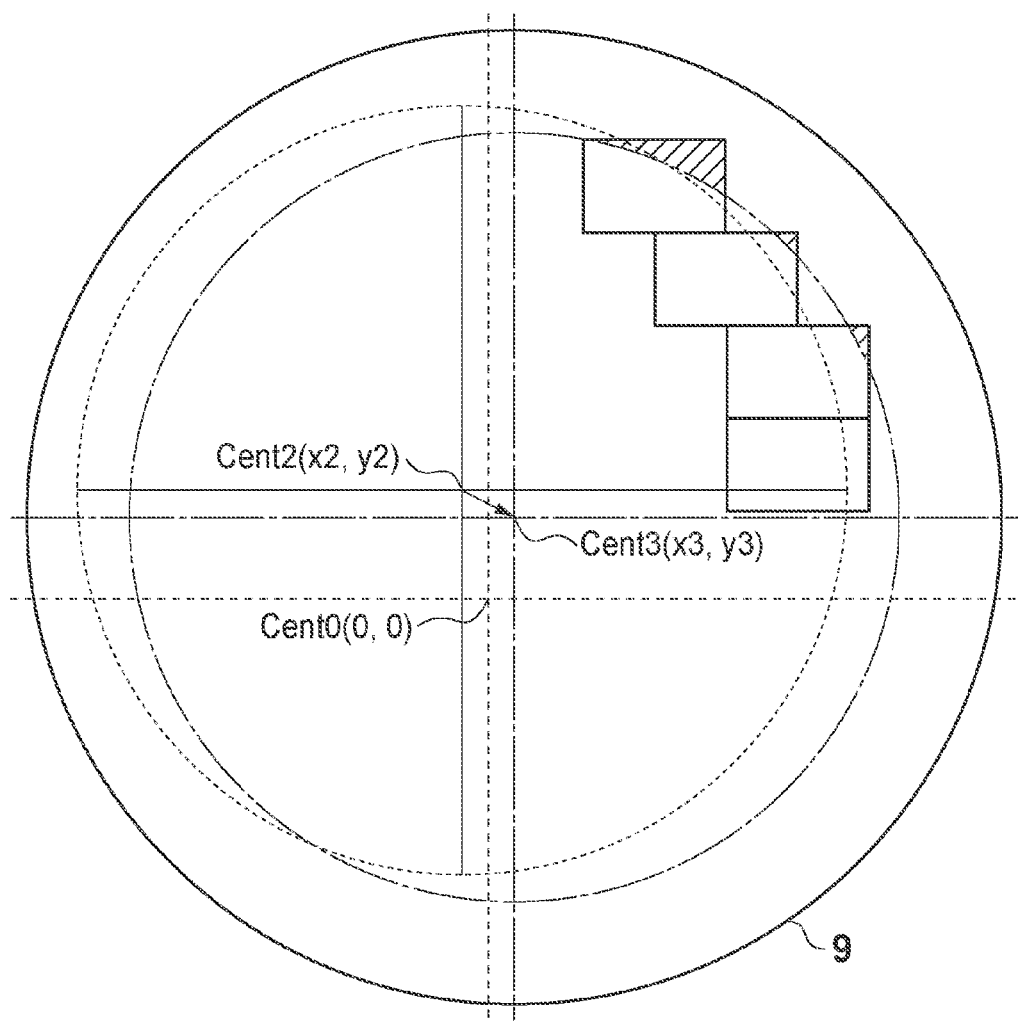
FIG. 15 is a view showing the case wherein the center of the substrate held by the substrate stage is shifted from that of the substrate stage, and the substrate center position of the substrate is shifted from the layer center position.

FIG. 15 is a view showing the case wherein the center of the substrate 9 held by the substrate stage 6 is shifted from that of the substrate stage 6, and the substrate center position of the substrate 9 is shifted from the layer center position. Referring to FIG. 15, the center position of the substrate stage 6 is indicated by Cent0(0, 0), the layer center position is indicated by Cent2(x2, y2), and the substrate center position is indicated by Cent3(x3, y3). A circle indicated by a solid line shows the outer periphery of the substrate 9. A circle indicated by a dotted line shows the boundary of a region shielded against light by the light shielding plate 19 when the light shielding plate 19 is controlled in the layer reference control mode, and a circle indicated by an alternate long and short dashed line shows the boundary of a region shielded against light by the light shielding plate 19 when the light shielding plate 19 is controlled in the outer shape reference control mode.

Referring to FIG. 15, in a substrate 9 having a layer formed on it, when the light shielding plate 19 is controlled in the layer reference control mode, the light shielding plate 19 is positioned based on only the layout information included in the exposure process information. However, in a substrate 9 having a layer formed on it, when the light shielding plate 19 is controlled in the outer shape reference control mode, the light shielding plate 19 is positioned based on the layout information and the shift amount between the substrate center position and the layer center position. Upon this operation, hatched portions are shielded against light by the light shielding plate 19. Note that the layout information and the shift amount between the substrate center position and the layer center position are calculated as the shift amount between the substrate center position and the layer center position in accordance with:

$$\left(\begin{array}{c}\text{Shift Amount between Substrate Center}\\ \text{Position and Layer Center Position}\end{array}\right) = \sqrt{(x3-x2)^2 + (y3-y2)^2} \quad (4)$$

Also, the substrate center position is calculated from the substrate placement offset, and the layer center position is calculated from the detection result obtained by the alignment detection unit 4.

FIGS. 16A to 16E are views for explaining a method of holding the substrate 9 on the substrate stage 6 so that the center of the substrate 9 coincides with that of the substrate stage 6. FIGS. 16A to 16E show in time series an operation of transferring the substrate 9 between the substrate stage 6 and a substrate transport robot 27. A layer LA including an alignment mark AM which can be detected by the alignment detection unit 4 is formed on the substrate 9. Reference symbol DP denotes a detection position at which the alignment detection unit 4 detects the alignment mark AM. Although only one detection position DP is shown in FIGS. 16A to 16E, two or more detection positions DP are typically set.

Figure 16A:
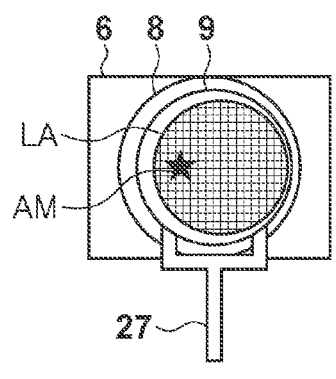
FIGS. 16A to 16E are views for explaining a method of holding the substrate on the substrate stage so that the center of the substrate coincides with that of the substrate stage.

First, as shown in FIG. 16A, the substrate stage 6 moves to a reception center position at which it receives the substrate 9 from the substrate transport robot 27. The substrate transport robot 27 holds and transports the substrate 9 to the position above the center position of the substrate stage 6 (chuck 8).

Figure 16B:
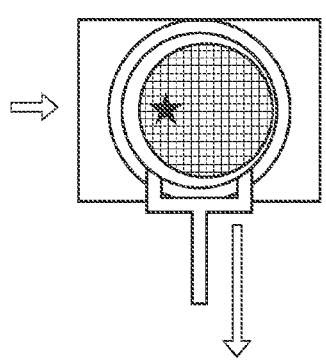

Then, as shown in FIG. 16B, the substrate stage 6 moves by a placement offset from the reception center position to receive the substrate 9 from the substrate transport robot 27. After transferring the substrate 9 to the substrate stage 6, the substrate transport robot 27 retracts in a direction indicated by an arrow. Note that the substrate stage 6 can also move at once to a position spaced apart by a placement offset from the reception center position at which the substrate stage 6 receives the substrate 9 from the substrate transport robot 27.

Figure 16C:
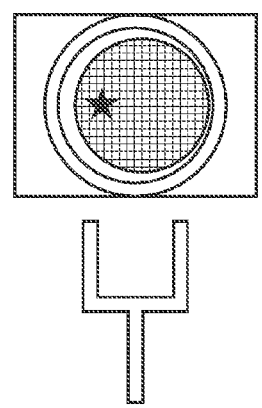
Figure 16D:
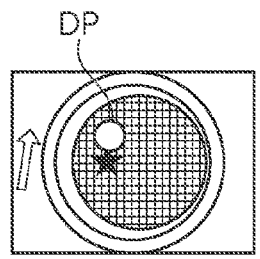
Figure 16E:
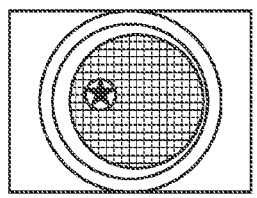

As shown in FIG. 16C, while the substrate center position of the substrate 9 coincides with the center position of the substrate stage 6, the substrate stage 6 moves so that the alignment mark AM formed on the substrate 9 is positioned at the detection position DP of the alignment detection unit 4. However, since the substrate center position does not coincide with the layer center position despite the movement of the substrate stage 6, the alignment mark AM is not positioned at the detection position DP of the alignment detection unit 4, as shown in FIG. 16D. Hence, the substrate stage 6 continues its movement while searching for the detection position DP until the alignment mark AM is positioned at the detection position DP of the alignment detection unit 4, as shown in FIG. 16E. The position of the detection position DP of the alignment detection unit 4 in a stage coordinate system can be calculated from the amount of movement of the substrate stage 6, and this amount of movement becomes the shift amount (layer shift amount) between the substrate center position and the layer center position.

Also, as shown in FIGS. 17A to 17G, light incident on an outer peripheral region shifted inward from the outer periphery of the substrate 9 by a predetermined width can be shielded by placing a ring-shaped light shielding plate 30 on the substrate 9, instead of using the light shielding plate 19. FIGS. 17A to 17E show in time series an operation of transferring the substrate 9 between the substrate stage 6 and the substrate transport robot 27, and are similar to FIGS. 16A to 16E, respectively, so a detailed description thereof will not be given.

When the detection of the alignment mark AM by the alignment detection unit 4 ends (FIG. 17E), a light shielding plate transport hand 29 holds the light shielding plate 30 and moves to a placement position at which it places the light shielding plate 30 on the substrate 9, as shown in FIG. 17F. Also, the substrate stage 6 which holds the substrate 9 similarly starts its movement to place the light shielding plate 30 on the substrate 9. Note that the movement target position of the substrate stage 6 is defined as a position shifted by the shift amount (layer shift amount) between the substrate center position and the layer center position from a position at which the center position of the light shielding plate 30 coincides with that of the substrate stage 6. Upon this operation, the light shielding plate transport hand 29 can place the light shielding plate 30 on the substrate 9 so that the center position of the light shielding plate 30 coincides with the layer center position, as shown in FIG. 17G. In this case, to match the center position of the light shielding plate 30 with the layer center position, the substrate stage 6 is moved to a position shifted by the layer shift amount from the position at which the center position of the light shielding plate 30 coincides with that of the substrate stage 6. However, when the light shielding plate transport hand 29 is moved to a position shifted by the layer shift amount from the placement position at which it places the light shielding plate 30 on the substrate 9 as well, the light shielding plate 30 can be placed on the substrate 9 so that the center position of the light shielding plate 30 coincides with the layer center position.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-135694 filed on Jun. 17, 2011, which is hereby incorporated by reference herein in its entirety.

What is claimed is:

1. An exposure apparatus comprising:
   an illumination optical system configured to illuminate a reticle with light from a light source;
   a projection optical system configured to project a pattern of the reticle onto a substrate;
   a light shielding plate which is placed on a plane conjugate to an object plane of the projection optical system in the illumination optical system, includes, on an edge thereof, an arc that overlaps a circular boundary line inside an outer periphery of the substrate, and is configured to define a region on the substrate, to which the pattern is to be transferred;
   a driving unit configured to drive the light shielding plate in an outer peripheral shot region on the substrate;
   a detection unit configured to detect a shift amount between the center position of the substrate and the center position of an array of a plurality of shot regions on a layer formed on the substrate; and
   a control unit configured to, in exposing the outer peripheral shot region, perform first control in which the control unit controls the driving unit so that the light shielding plate is positioned at a position, at which the light shielding plate shields light incident on an outer peripheral region shifted inward from the outer periphery of the substrate by a predetermined width, based on the shift amount detected by the detection unit.

2. The apparatus according to claim 1, wherein as the first control, the control unit controls the driving unit so that the edge projected onto an image plane of the projection optical system is positioned on a circular boundary line of an outer peripheral region shifted by a width equal to a sum of the predetermined width and the shift amount from a virtual outer periphery of the substrate obtained from a position of the outer peripheral shot region.

3. The apparatus according to claim 1, wherein in exposing the outer peripheral shot region, the control unit selectively performs the first control and second control in which the control unit controls the driving unit so that the light shielding plate is positioned at a position at which the light shielding plate shields light incident on an outer peripheral region shifted by the predetermined width from a virtual outer periphery of the substrate obtained from a position of the outer peripheral shot region.

4. The apparatus according to claim 3, wherein the control unit performs the first control if a layer is formed on the substrate, and performs the second control if no layer is formed on the substrate.

5. A device fabrication method comprising steps of:
   exposing a substrate using an exposure apparatus; and
   performing a development process for the substrate exposed,
   wherein the exposure apparatus includes:
   an illumination optical system configured to illuminate a reticle with light from a light source;
   a projection optical system configured to project a pattern of the reticle onto the substrate;
   a light shielding plate which is placed on a plane conjugate to an object plane of the projection optical system in the illumination optical system, includes, on an edge thereof, an arc that overlaps a circular boundary line inside an outer periphery of the substrate, and is configured to define a region on the substrate, to which the pattern is to be transferred;
   a driving unit configured to drive the light shielding plate in an outer peripheral shot region on the substrate;
   a detection unit configured to detect a shift amount between the center position of the substrate and the center position of an array of a plurality of shot regions on a layer formed on the substrate; and
   a control unit configured to, in exposing the outer peripheral shot region, perform first control in which the control unit controls the driving unit so that the light shielding plate is positioned at a position, at which the light shielding plate shields light incident on an outer peripheral region shifted inward from the outer periphery of the substrate by a predetermined width, based on the shift amount detected by the detection unit.

* * * * *